United States Patent [19]

Brown et al.

[11] Patent Number: 5,008,492
[45] Date of Patent: Apr. 16, 1991

[54] HIGH CURRENT FEEDTHROUGH PACKAGE

[75] Inventors: Raymond L. Brown, Fountain Valley; Clifford L. Shock, Jr., Santa Ana, both of Calif.

[73] Assignee: Hughes Aircraft Company, Los Angeles, Calif.

[21] Appl. No.: 424,414

[22] Filed: Oct. 20, 1989

[51] Int. Cl.⁵ ............................................ H01L 23/02
[52] U.S. Cl. ..................................... 174/52.4; 357/74
[58] Field of Search ................... 174/52.1, 52.2, 52.3, 174/52.4; 357/71, 74, 80; 29/879

[56] References Cited

U.S. PATENT DOCUMENTS

| | | | |
|---|---|---|---|
| 4,451,540 | 5/1984 | Baird et al. | 174/52.4 |
| 4,649,229 | 3/1987 | Scherer et al. | 174/52.4 |
| 4,656,499 | 4/1987 | Butt | 174/52.4 |

Primary Examiner—Leo P. Picard
Assistant Examiner—Bot L. Ledynh
Attorney, Agent, or Firm—Terje Gudmestad; W. K. Denson-Low

[57] ABSTRACT

A high current feedthrough package comprising a plurality of alternating rings respectively comprising a thermally conductive material and an electrically conductive material. The thermally conductive rings comprise a thermally conductive ceramic material such as aluminum nitride, while the electrically conductive rings comprise a material such as molybdenum, or one of its alloys, for example. The package is thus comprised of alternating rings or laminations of aluminum nitride and molybdenum, for example, that are stacked or layered to form a wall. The layered wall is brazed in a single step onto a base. The molybdenum rings act as high current feedthroughs and comprise tabs on the inner and outer perimeter which are available for interconnection to devices disposed within the enclosure and to external circuits. The aluminum nitride rings provide electrical isolation between the feed-through rings. The high thermal conductivity of the molybdenum and aluminum nitride provides for excellent thermal dissipation from the package. Forced convective cooling may also be used to further increase the current carrying capability of the package. Methods of fabricating the package are also disclosed.

20 Claims, 1 Drawing Sheet

HIGH CURRENT FEEDTHROUGH PACKAGE

BACKGROUND

This invention relates to microelectronics packaging technology and, more specifically, to the provision of an enclosure for microelectronics power circuits having high current feedthroughs and to a method for making same.

In the field of microelectronics packaging technology, present practice is to utilize feedthroughs comprising Kovar pins sealed with glass in a Kovar ring frame. The poor thermal conductivity of the glass coupled with the poor thermal and electrical conductivity of the Kovar leads to excessive heating of the feedthroughs when conducting high current. As a result, the current carrying capacity of currently used packages are limited to about five amperes continuous current per package feedthrough due to heating thereof, although forty amperes is acceptable for intermitent current flow at a low duty cycle.

It is therefore objective of this invention to increase the current carrying capability of package feedthroughs by eliminating glass-to-metal seals. Another objective of the present invention is the provision of a power package in which high currents can be routed through the package wall. Yet another objective is to provide tabs that can be evenly spaced along the inner and outer perimeter of the package to allow bussing of current to any point along the walls. A stil further objective is to utilize package walls for current routing to allow increased circuit density. A further objective is to employ feedthroughs along the outer perimeter of the package that act as fins to increase thermal dissipation from the conductors. Yet another objective is to provide feedthroughs having high thermal conductivity and a large contact area to cool the feedthroughs and overcome the above-identified problems with conventional glass feedthroughs.

SUMMARY OF THE INVENTION

In accordance with these and other objectives and features of the invention, there is provided a high current feedthrough package comprising a plurality of alternating rings respectively comprising a thermally conductive material and an electrically conductive material. The thermally conductive material may be a metal oxide or a ceramic, such as aluminum nitride or beryllium oxide, while the electrically conductive material may be comprised of molybdenum or one of its alloys, for example.

The feedthroughs transmit high currents into and out of the package without causing excessive heating. The package is comprised of alternating rings or laminations of aluminum nitride and molybdenum or one of its alloys, such as titanium zirconium molybdenum (TZM), for example, that are stacked or layered to form a wall. The layered wall is brazed in a single step onto a base. The electrically conductive molybdenum rings, for example, are employed as the high current feedthroughs and include tabs on the inner and outer perimeter which are available for interconnection to devices disposed within the enclosure and to external circuits. The thermally conductive aluminum nitride rings, for example, provide electrical isolation between the feedthrough rings or layers. The high thermal conductivity of the molybdenum and aluminum nitride provides for excellent thermal dissipation from the leads to the package base. Forced convective cooling may also be used to further increase the current carrying capability of the package.

A method of fabricating an enclosure having high current feedthroughs comprises the following steps. First, a thermally conductive ring comprising aluminum nitride for example, is disposed on a base. Then, an electrically conductive ring comprising nickel-plated molybdenum, for example, is disposed on the thermally conductive ring of aluminum nitride. Then additional rings of aluminum nitride and nickel-plated molybdenum are disposed on each other until a desired enclosure wall height is reached. The wall height is generally dependent upon the number of inputs and outputs required. Then a seal ring is typically disposed on the top-most ring of aluminum nitride. Then the assembly is brazed to form the completed package. This is typically accomplished by a conventional one-step brazing operation. The enclosure may then be plated with a combination of gold and nickel. After brazing and plating, the package may then be seam sealed using conventional methods. Finally, a lid comprising Kovar or molybdenum, for example, may be disposed on the seal ring.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 1:
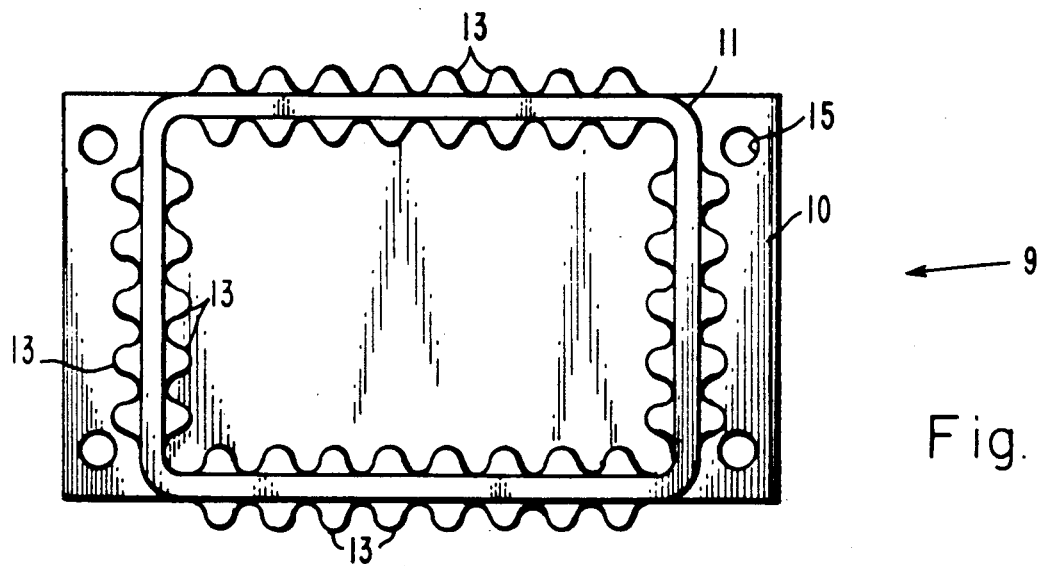
FIG. 1 is a plan view of the high current feedthrough package constructed in accordance with the principles of the present invention showing a hallow rectangular enclosure for microelectronics having feedthroughs located around the internal and external periphery thereof.

Referring now to FIG. 1 of the drawings, there is shown a package 9 in accordance with the principles of the present invention, which includes a substantially flat thermally conductive rectangular base 10, to which a plurality of layers or laminations are built up or stacked in layers to form a wall 11 surrounding a hollow enclosure 16. The base 10 is preferably made out of a low thermal expansion material, such as molybdenum or ceramic, for example. The flat base 10 has openings 15 at all four corners for fastening devices such as screws, for example, which can be used to fasten or mount the package 9 to other objects. A plurality of thermally and electrically conductive tabs 13 are offset around the interior and exterior periphery of each layer of the enclosure 16 protruding from the interior and exterior surfaces of the wall 11. The tabs 13 are made out of a metal having a high electrical and thermal conductivity, such as molybdenum, for example. The tabs 13 have two uses, the first is to pass current to any internal or external point along the wall 11 of the enclosure 16, the second is to radiate heat with the tabs 13 used as cooling fins to increase thermal dissipation. The tabs 13 are plated with nickel and gold to facilitate bonding interconnecting wires or other circuit elements. The topmost layer of the wall 11 of the enclosure 16 is a seal ring 14 (shown in FIGS. 2 and 3) having no tabs 13 which may be made of molybdenum. The seal ring 14, and thus the package 9 or enclosure 16, may be sealed with a lid 21 (shown in FIG. 2) made of Kovar or molybdenum, for example.

Figure 2:
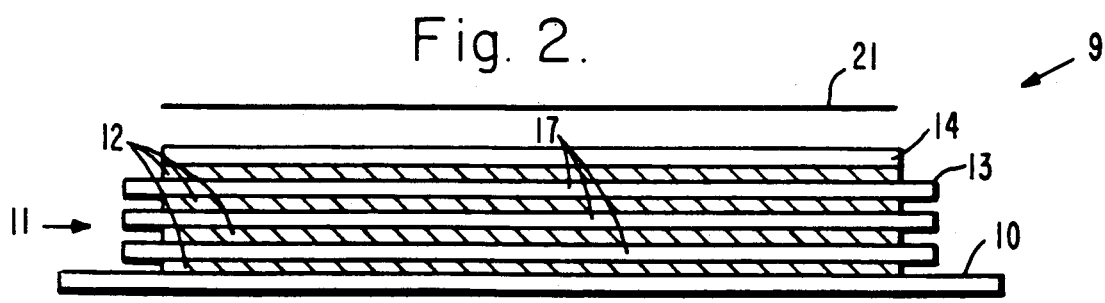
FIG. 2 is a side view of the high current feedthrough package of FIG. 1 showing alternating layers of aluminum nitride rings and nickel-plated molybdenum rings stacked to form the enclosure.

Referring now to FIG. 2, the wall 11 of the enclosure 16 is built up on the base 10, by using four layers of aluminum nitride rings 12 alternating with three layers of nickel-plated molybdenum rings 17 with nickel-plated molybdenum tabs 13 offset around their periphery. This is by way of example only, and it will be understood that the number of layers or laminations that are stacked to build up the wall 11 will depend on the application at hand. Molybdenum and aluminum nitride were chosen because they have a good thermal coefficient of expansion match. Upon the last or uppermost aluminum nitride ring 12 is placed the seal ring 14, which may be made of nickel-plated molybdenum. The wall 11 of the enclosure 16 is brazed together using a one-step brazing operation. After brazing, the wall 11 of the enclosure 16 is plated with nickel and gold to facilitate bonding to the molybdenum tabs 13. It will be understood that the plating is applied only to the molybdenum and not to the aluminum nitride. The lid 12 is shown above the completed package prior to sealing.

In addition, the aluminum nitride rings 12 may be metalized and nickel plated, for example, to allow the use of other types of brazing alloys. In these instances, only the top and bottom of each aluminum nitride ring 12 would be metalized, since electrical isolation between the alternating rings 12, 17 is desired. Once the aluminum nitride rings 12 are metalized, an active brazing alloy such as "Ticusil," available from GTE Wesgo, or a standard brazing alloy such as "Cusil", for example, also available from GTE Wesgo may be employed to braze the assembly. The metalized aluminum nitride rings 12 may be metalized by means of plating by a conventional thin film process using titanium-tungsten (TiW) and gold, or other refractory metalization such as molybdenum and manganese, for example.

Figure 3:
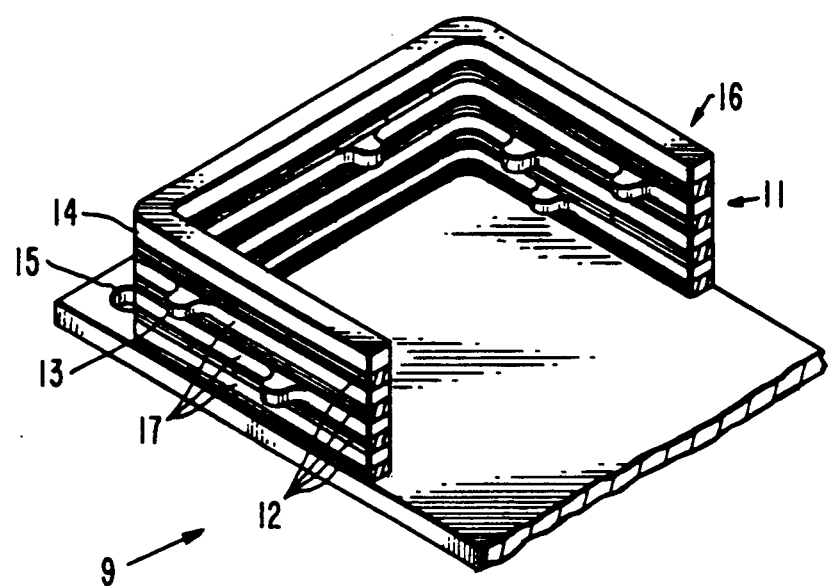
FIG. 3 is a perspective view partly in cross-section of the high current feedthrough package of FIGS. 1 and 2, showing nickel-plated molybdenum interconnection tabs used for feedthroughs located at different levels and offset from level-to-level for ease of interconnection.

Referring now to FIG. 3, which is a perspective view, partly in cross section of the enclosure 16, showing the flat base 10 upon which are built up the alternating layers of aluminum nitride rings 12 and nickel-plated molybdenum rings 17. The nickel-plated molybdenum tabs 13 that are molded onto or made integral with the nickel-plated molybdenum rings 17 may be seen to be offset from level to level for ease of interconnection. The top-most layer of the wall 11 of the enclosure 16 is the seal ring 14 made of nickel-plated molybdenum, for example.

Thus there has been described a new and improved package having high current feedthroughs. The package can carry about 100 amperes input current per lead during continuous operation, which is a marked improvement over conventional high power package designs. The package design increases the current carrying capability of its feedthroughs by eliminating glass-to-metal seals. The package provides for routing of high currents through the package walls. The package provides tabs that may be spaced along the inner and outer perimeter of the walls to allow bussing of current to any point along the walls. The package utilizes its walls for current routing to allow increased circuit density. The package employs feedthroughs along the outer perimeter thereof that act as fins to increase the thermal dissipation from the conductors.

It is to be understood that the above-described embodiment is merely illustrative of some of the many specific embodiments which represent applications of the principles of the present invention. Clearly, numerous and other arrangements can be readily devised by those skilled in the art without departing from the scope of the invention.

What is claimed is:

1. A package having high current feedthroughs comprising:

a base comprising a low thermal coefficient of expansion material; and a plurality of alternating thermally conductive and electrically conductive rings stacked on the base to define an enclosure, the electrically conductive rings having a plurality of internal and external tabs defining high-current feedthroughs, the thermally conductive rings providing electrical isolation between the feedthroughs.

2. The package of claim 1 wherein the thermally conductive rings comprise a thermally conductive ceramic material.

3. The package of claim 2 wherein the thermally conductive ceramic material comprises aluminum nitride and the electrically conductive rings comprise molybdenum.

4. The package of claim 1 wherein the electrically conductive rings comprise nickel-plated molybdenum.

5. The package of claim 1 wherein the thermally conductive rings comprise a thermally conductive metallic oxide material.

6. The package of claim 1 wherein the tabs are offset around the periphery of the electrically conductive rings so that the stacked arrangement of rings has respective ones of the tabs at different relative locations at different levels.

7. The package of claim 1 further comprising a seal ring disposed on the top of the plurality of rings.

8. The package of claim 7 wherein the seal ring comprises nickel plated molybdenum.

9. The package of claim 1 further comprising a lid sealed to the seal ring.

10. The package of claim 1 wherein the rings of the package are brazed together.

11. The package of claim 1 wherein the package is plated with nickel and gold.

12. An enclosure having high current feedthroughs comprising:

a substantially flat ceramic base;

a plurality of alternating electrically conductive and insulating rings having relatively high thermal conductivity, the rings being stacked on the base to define a hollow enclosure, the electrically conductive rings having a plurality of internal and external tabs defining high-current feedthroughs, the alternating insulating rings providing electrical isolation between the feedthroughs, the tabs being offset around the periphery of the rings so that the stacked arrangement of rings has respective locations of the tabs at different relative locations at different levels; and a seal ring made of electrically conductive and thermally conductive metal disposed on the top of the plurality of rings; and a lid made of high electrically resistive metal disposed on the seal ring.

13. An enclosure having high current feedthroughs comprising:

a substantially flat low thermal expansion metal base; and a plurality of alternating aluminum nitride rings and nickel-plated molybdenum rings; said nickel-plated molybdenum rings having a plurality of internal tabs and a plurality of external tabs for defining high-current feedthroughs; said tabs being offset around the periphery of said nickel-plated molybdenum rings so that the stacked arrangement of said rings will have respective ones of said tabs at different relative locations at different levels; said aluminum nitride rings providing electrical isolation between said feedthroughs; said alternating rings being stacked on said base to define a hollow enclosure for microelectronics.

14. A package having high current feedthroughs comprising:

a base comprising a low thermal coefficient of expansion material; and a plurality of alternating aluminum nitride and nickel-plated molybdenum rings stacked on the base to define an enclosure, the nickel-plated molybdenum rings having a plurality of internal and external tabs defining high-current feedthroughs, the aluminum nitride rings providing electrical isolation between the feedthroughs.

15. The package of claim 14 the tabs are offset around the periphery of the nickel-plated molybdenum rings so that the stacked arrangement of rings has respective ones of the tabs at different relative locations at different levels;

16. The package of claim 14 further comprising a seal ring disposed on the top of the plurality of rings.

17. The package of claim 16 wherein the seal ring comprises nickel plated molybdenum.

18. The package of claim 14 further comprising a lid sealed to the seal ring.

19. The package of claim 14 wherein the rings of the package are brazed together.

20. The package of claim 14 wherein the package is plated with nickel and gold.

* * * * *